United States Patent [19]
Aitel

[11] 4,115,656
[45] Sep. 19, 1978

[54] SHIELDED PASSAGEWAY INTERCONNECTION FOR ELECTROMAGNETIC INTERFERENCE SHIELDED SHELTERS

[75] Inventor: Moe Lawrence Aitel, Andover, Mass.

[73] Assignee: Sanders Associates, Inc., Nashua, N.H.

[21] Appl. No.: 674,810

[22] Filed: Apr. 8, 1976

[51] Int. Cl.² .............................................. H05K 9/00
[52] U.S. Cl. ................................. 174/35 MS; 52/67; 52/79.8
[58] Field of Search .............. 174/35 MS, 35 R, 65 R; 52/287, 573, 588, 270, 79.7, 79.8, 67; 285/405, 406, 412

[56] References Cited

U.S. PATENT DOCUMENTS

| | | | |
|---|---|---|---|
| 979,652 | 12/1910 | Church | 285/405 X |
| 2,716,782 | 9/1955 | Paulsen | 52/79.8 X |
| 2,840,866 | 7/1958 | Paulsen | 52/79.8 X |
| 2,841,832 | 7/1958 | Couse et al. | 52/79.8 X |
| 3,110,753 | 11/1963 | Witort | 174/65 R |
| 3,350,497 | 10/1967 | Weaver, Jr. et al. | 174/35 MS |

Primary Examiner—J. V. Truhe
Assistant Examiner—D. A. Tone
Attorney, Agent, or Firm—Louis Etlinger; Robert K. Tendler

[57] ABSTRACT

A shielded passageway for use between electromagnetic interference shielded shelters includes two or more rigid telescoping members in a loose fit with EMI shielding material between the overlapping sections. In one embodiment a truncated toroidally-shaped rolling diaphragm shield of wire mesh is interposed between the overlapping sections to permit relative movement therebetween while maintaining or providing EMI shielding. In another embodiment the passageway is provided with an articulated stable walkway attached at either end to respective passageway sections for permitting relative movement between the overlapped passageway sections. In a further embodiment a tongue-and-groove system is provided for securing a passageway section to an adjacent shelter which involves first hooking the lower lip of the passageway onto a mating groove in the shelter and then pulling the top portion of the passageway towards the shelter, with all bolting and securing connections to be made solely within the confines of the shelter where the connecting apparatus is readily accessible.

26 Claims, 13 Drawing Figures

SHIELDED PASSAGEWAY INTERCONNECTION FOR ELECTROMAGNETIC INTERFERENCE SHIELDED SHELTERS

FIELD OF THE INVENTION

This invention relates to shielded passageways and interconnection systems for the interconnecting of adjacent electromagnetic interference (EMI) shielded shelters and more particularly to the utilization of rigid wall overlapping telescoping passageway sections carried in a loose fit in which the sections are sealed against electromagnetic leakage by means carried between the overlapping portions of the passageway sections.

BACKGROUND OF THE INVENTION

In general this invention relates to portable electronic equipment shelters of the type which are shielded against weather and against either the ingress or egress of electromagnetic radiation. Shelters in the past have been provided to house electronic equipment which must be shielded from outside electromagnetic radiation. The shelter also functions to prevent electromagnetic radiation generated during equipment operation from being emitted outside the shelter. In both respects it is important to protect the equipment within a shelter from either outside electromagnetic radiation or from the possibility of electronic eavesdropping by nearby detectors. For many secure applications more than one portable shelter is provided to make up a complex of shelters and it is desirable to connect up the shelter modules with passageways. The passageways not only provide ingress and egress to people operating the electronic equipment within a shelter, the transportation of equipment from one shelter to another, and the protection of people and equipment from the outside environment, but also provides eavesdrop protection. In addition to these functions the passageway must be easily installed and must provide better shielding than has heretofore been accomplished.

One type of passageway which has been utilized in the past is described in U.S. Pat. No. 3,350,497 issued to John R. Weaver, Jr. and Charles J. Carson on Oct. 31, 1967. This passageway is comprised generally of accordion type bellows or plaits connected between two adjacent shelters, with a telescoping walkway running through the passageway. The walkway incorporates loosely fitted telescoping sections to accommodate misalignment of the shelters.

While the above described bellows type passageway is satisfactory for certain applications, the bellows type member presents problems when the fabric utilized for the bellows ages. In particular, it will be appreciated that bellows derive their flexibility by flexing at the peaks of the bellow structure. When this structure has been worked for a considerable period of time the typical failure mode is a slot or line type crack at the peak of the bellows. When this occurs a slot antenna is in effect provided which not only permits the leakage of electromagnetic radiation from the interior to the exterior, but also acts as a miniature antenna for enhancing the transmission of electromagnetic radiation. Moreover, in the configuration shown in this patent, the bellows member is exposed to the external environment and more particularly to sunlight which after a period of time causes cracking of the weather resistant portions of bellows member. In addition to the exposure of the resilient member to weathering, the loose fitting walkway is at times unstable under foot which may cause the person walking through the passageway to lose his balance and fall against the bellow walls where sharp cornered equipment he may be carrying could puncture the walls, thereby breaching the EMI shield.

The reason for the use of the bellows is that it has long been recognized that two adjacent shelters may not be accurately aligned because of differences in the terrain and that the interconnection of shelters by rigid members would require complicated alignment of the shelters.

The above problems are solved by the subject invention by the provision of rigid walled loosely fitting telescoping passageway sections, with the EMI shielding material resilient and positioned between the loosely fitting and overlapping sections of the passageway. This permits relative movement of the passageway sections to accommodate misalignment between adjacent shelters while at the same time providing EMI shielding. The advantage of the rigid wall construction is twofold. First when these walls are made out of aluminum the aluminum weathers equally as well as the shelters to which the passageway is attached, and can be structurally, electrically and thermally the same as the walls of the shelters. Moreover, it will of course be appreciated that the aluminum weathers better than resilient fabric. Also, it is more resistant to puncture should, for instance, a piece of apparatus fall against one of the sides of the passageway. Secondly, because of the overlapping structure, all of the EMI shielding material is protected both from weather and sunlight and also against puncture from within or without. Moreover, the EMI shield does not degrade significantly over a number of years because the outer portion of the telescoping passageway procts the EMI shielding material from the outside environment and because the inner passageway section protects the EMI shielding material against damage from within.

In one embodiment, the EMI shielding material is in the form of a rolling diaphragm made out of a fine conductive mesh in the form of a truncated torus which in one embodiment may be one half a hollow donut shaped shell or more particularly a hollow torus divided along a plane parallel to the plane of one of the faces of the torus.

The longitudinally extending top and bottom edges of the rigid side walls of the passageway are rounded or radiused to provide for smooth rolling movement of the EMI diaphragm between the loose fitting passageway sections to accommodate any misalignment between the shelters. In one embodiment there are two passageway sections, with one passageway section being fastened to and/or cantilevered from one shelter and the other passageway section being fastened to and/or cantilevered from the adjacent shelter.

While rolling diaphragms have been utilized in the past, for sealing natural gas tanks for instance, the novel use of the rolling diaphragm shield in the current invention has the effect of increasing the integrity of the EMI shield over the prior art by as much as 20 dB. This is due in part to the permanent, nonsliding joints between the diaphragm and the rigid passageway sections, and in part to the very gentle flexure imposed by the rolling diaphragm upon the conductive mesh, which allows it to be made finer and denser than if it had to be flexed sharply, as in a bellows structure. Put another way, with the use of the rolling diaphragm shield in the rigid overlapping and telescoping passageway, an improvement of 20 dB in interference suppression is provided. A second truncated toroidal member may be utilized as a weather seal between the overlapped passageway sections for further protection of the rolling diaphragm EMI shield against the environment, although this weather seal may not be necessary in view of the overlapping protection given by the outer passageway section. However, the weather seal is necessary to maintain airconditioning integrity, both as to heat and cold.

In order to overcome the problem of the loose fitting walkway of the prior art, either the walkway is provided with snug fitting telescoping sections, with one loose fitting pair of couplings and one set of tight fitting couplings, so that the passageway has rigid support from one of the shelters, or an articulated walkway is provided within the passageway and is secured at either end to a rigid portion of the appropriate passageway section. In this latter embodiment the walkway is hinged in a horizontal direction at opposing ends of the walkway to the floor portions of the adjacent passageway section to allow for vertical displacement of one shelter from the other. The walkway is then hinged in a vertical direction from the first mentioned hinge members to allow for horizontal displacement of the shelters in a direction normal to the line joining the shelters through the passageway. Moreover, as shown in the aforementioned patent, telescoping walkway sections are utilized to accommodate different separations between two adjacent shelters. By virtue of the utilization of this type of walkway, various misalignments between adjacent shelters can be easily accommodated, while providing stability under foot. A significant advantage of this embodiment is the simplification of the installation process and the attendant reduction in installation time. Also, since the walkway is part of and shipped with the passageway, no separate provision need be made for storing the walkway.

While the subject passageway may in one embodiment be provided with laterally extending flanges at the ends of the passageway which are secured to the shelters outside of their portals, it will be appreciated that installation is difficult since the installer must bolt the passageway on from the outside. In general with the utilization of this type of flange, the installer must stand on a ladder and reach over the top of the passageway and lie on the ground to reach under the passageway during the installation. The installer is thus exposed to the elements and reaching all flange bolts for the passageway is inconvenient at best. However, in a further embodiment of this invention a mounting system is provided in which all securing of the passageway sections to their respective shelters is accomplished from within the two shelters being joined. In one embodiment each passageway section contains a tongue at the bottom which mates with a groove in its adjacent shelter. In order to install the passageway, the passageway tongue or lip is merely raised above and lowered into the mating groove at the bottom of the shelter such that the shelter initially supports the passageway in this manner. Thereafter, the top portion of the passageway is drawn towards the top portion of the shelter where the securing apparatus from the passageway projects into the shelter. After bolting, the passageway is supported both by the tongue and groove structure and also by the securing apparatus projecting into the shelter. Since the securing apparatus projects into the shelter the passageway may be secured by an installer within the shelter. All of the bolting or securing apparatus is made accessible to the person within the shelter and within easy reach such that not only is the individual sheltered from the elements during installation, but also all bolting or securing apparatus is within arms reach. This is important both in bitter cold climates and in very hot climates and, further, permits installation of the passageway in a matter of minutes. In a still further embodiment, a double tongue and groove type mounting structure is provided which can be installed from inside the shelter.

It is therefore an object of this invention to provide improved method and apparatus for the joining of two adjacent shelters while providing improved EMI shielding.

It is another object of this invention to provide an improved passageway for the interconnection of shelters in which the passageway is fabricated with rigid walls which are telescoping in a loose fit and wherein the EMI shielding material is between the overlapping passageway sections.

It is a still further object of this invention to provide a shelter interconnection system which is easily installed and which is stable when installed.

It is another object of this invention to provide a shielded passageway between shelters in which EMI shielding efficiency is increased by 20 dB over that currently obtainable.

It is a still further object of this invention to provide an improved articulated walkway for use in passageways between shelters in which the articulated passageway is affixed at either end to the passageway sections.

It is yet another object of this invention to provide a rolling diaphragm shield between telescoping and overlapping passageway sections for providing improved EMI suppression.

These and other objects of this invention will be better understood in connection with the following description in view of the appended drawings in which:

DETAILED DESCRIPTION

Figures 1, 2:
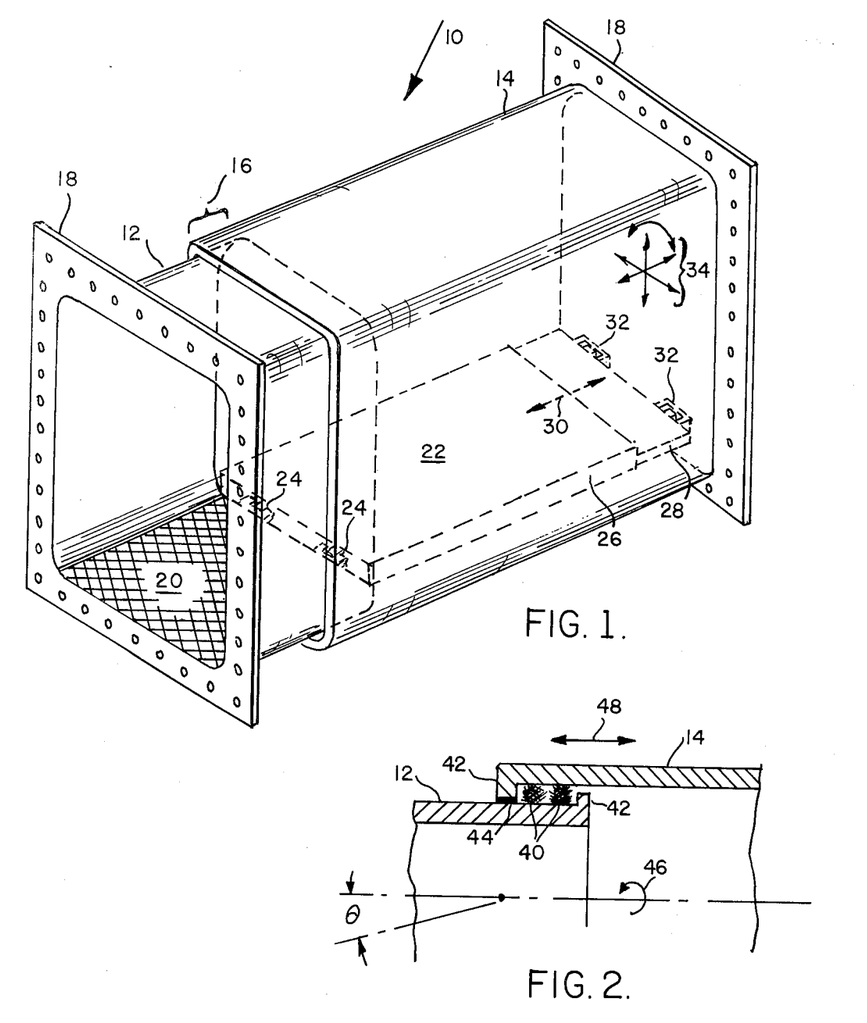
FIG. 1 is an isometric view of one embodiment of the subject invention illustrating a two-section telescoping passageway.
FIG. 2 is a sectional and diagrammatic illustration of overlapping portions of the passageways illustrating the utilization of EMI electrically conductive packing material and/or resilient seals between the overlapping sections.

Referring now to FIG. 1, an EMI shielded passageway 10, in one embodiment includes a short section 12 telescopically and loosely received in a long section 14. As illustrated both sections have rounded edges in one embodiment to permit a rolling diaphragm shield to be described hereinafter to roll between the overlapped portions of the two sections. This overlapped portion is illustrated at reference character 16. In the preferred embodiment the sections of the passageway are rigid and are electrically conductive. Each passageway section has means 18 for securing the passageway to an adjacent shelter. In the illustrated embodiment this means is in the form of an external circumferential flange which is electrically conductive and electrically connected to the passageway.

Short passageway section 12 has a floor portion 20 which serves as a portion of the walkway of the passageway. A telescoping walkway 22 is hingedly attached to floor portion 20 by hinge assemblies 24. Unlike the walkway in the prior art, the telescoping walkway sections are tight fitting so that virtually the only movement provided is by hinge assemblies 24 which result in movement in an angular direction about the hinge pin. It will be appreciated that when short section 12 is secured to its corresponding shelter the stability of the walkway is improved by virtue of the tight fitting walkway sections and the tight fitting hinges between the short section and walkway and also because of the short lever arm of this section.

Walkway 22 includes an outer section 26 and an inner section 28 which is telescopically and slideably mounted within section 26. The translation afforded by this telescopic arrangement is illustrated by double ended arrow 30. The free end of walkway section 28 is secured to an adjacent shelter by virtue of loose fitting hinge members here diagrammatically illustrated at 32. By virtue of these loose fitting hinge type structures relative motion between the two passageway sections illustrated by arrows 34 can be accommodated within the limits of these hinges and the translation ability of the telescoping walkway. What will be appreciated is that there is a certain amount of misalignment which can be accommodated by this structure due to the telescoping nature of the passageway sections, the telescoping nature of the walkway section and the loose fit of hinge apparatus 32. Moreover, it will be appreciated that the long passageway section which has a long lever arm is not exposed to loading from the walkway since the walkway is suspended so that it does not touch the long passageway section.

In one embodiment the passageway elements are made out of aluminum and all exterior edges of the short interior section are radiused at 6 inches or greater with an overall passageway height of 100 inches and a width of 52 inches. In another embodiment the passageway need only be of a size to accommodate interconnecting cables and wires.

As will be described, the flange member securing means 18 may be provided with conductive caulking material so as to maintain a perimeter of electrical conductivity at the portal or opening of each shelter between the surface of the shelter surrounding the portal and the surface of the passageway adjacent the surface of the shelter surrounding the portal.

Referring now to FIG. 2, EMI shielding material in the form of resilient conductive stuffing material 40 is provided between overlapped portions of passageway sections 12 and 14. In this embodiment the passageway sections are provided with annular lip portions 42 for containing the conductive stuffing material which may be resilient wire mesh, formed or compressed, made of monel, aluminum or tin plated copper clad steel.

In addition to conductive stuffing material 40 a conductive grease type seal 44 may be provided between one of the lips and an adjacent surface of one of the passageway sections.

Misalignment of the shelters will cause the passageway sections to move relative to one another as illustrated by angle $\theta$. The loose fit also accommodates the twisting misalignment illustrated by arrow 46. In one embodiment, the pivot point between the sections is the junction between the lip extending inwardly from the outer telescoping section and the point of contact of this lip with the inner telescoping section. Translation such as that illustrated by the double ended arrow 48 can also be accommodated in this embodiment.

It will be appreciated that conductive stuffing material is resilient and bears against the opposing surfaces of the passageway sections.

Figure 3:
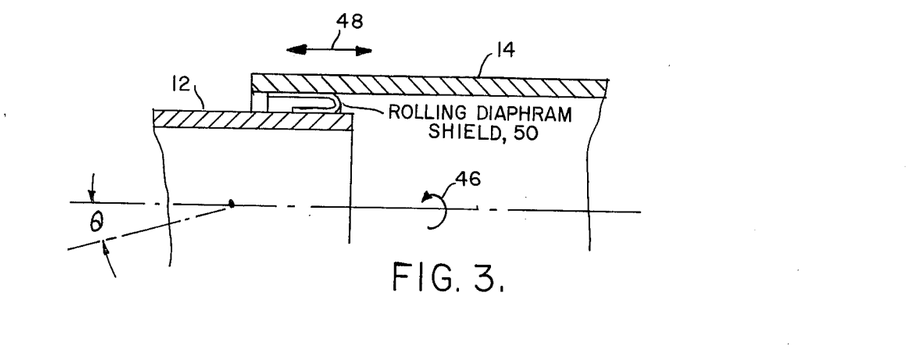
FIG. 3 is a partial sectional view of overlapping sections of the subject passageway illustrating the position of a rolling diaphragm shield.

Referring now to FIG. 3, a portion of a rolling diaphragm shield 50 is shown positioned between overlapping portions of passageway sections 12 and 14. As can be seen the rolling diaphragm shield is protected from the outside environment by the overlapping portion of passageway section 14 and is protected from puncture or other types of damage from the interior of the passageway by the overlapping section of passageway 12.

The rolling diaphragm shield in a preferred embodiment is made out of resilient layers of knitted metallic fiber with a resilient electrically insulating material such as knitted jersey sandwiched between the metallic layers. The dividing of the shield into isolated layers increases the efficiency of the shield. The resiliency of the rolling diaphragm shield is important to accommodate relative movement between the overlapping passageway sections. A rolling diaphragm of this type will permit the same type of misalignment described above.

The basic knitted wire mesh from which can be fabricated a rolling diaphragm shield such as described is available from Metex Corporation having a place of business at Edison, N.J. As used by Metex in a zipper-closed cable shielding tubing, the EMI suppression for three double layers of this material in free contact with each other at 14 KHz is 52 dB, at 18 MHz is 75 dB and at 1.06 Hz is 55 dB. For the purposes of the rolling diaphragm, the layers may be separated by insulating material, as previously described. When each of the layers of this rolling diaphragm shield is properly connected to opposing surfaces of the overlapped passageway sections, the entire structure is capable of approximately 60 dB EMI suppression at the frequency for which the EMI suppression is least, and greater than 60 dB at other frequencies which is approximately 20 dB better than that obtainable with current bellows type passageways.

Figure 4:
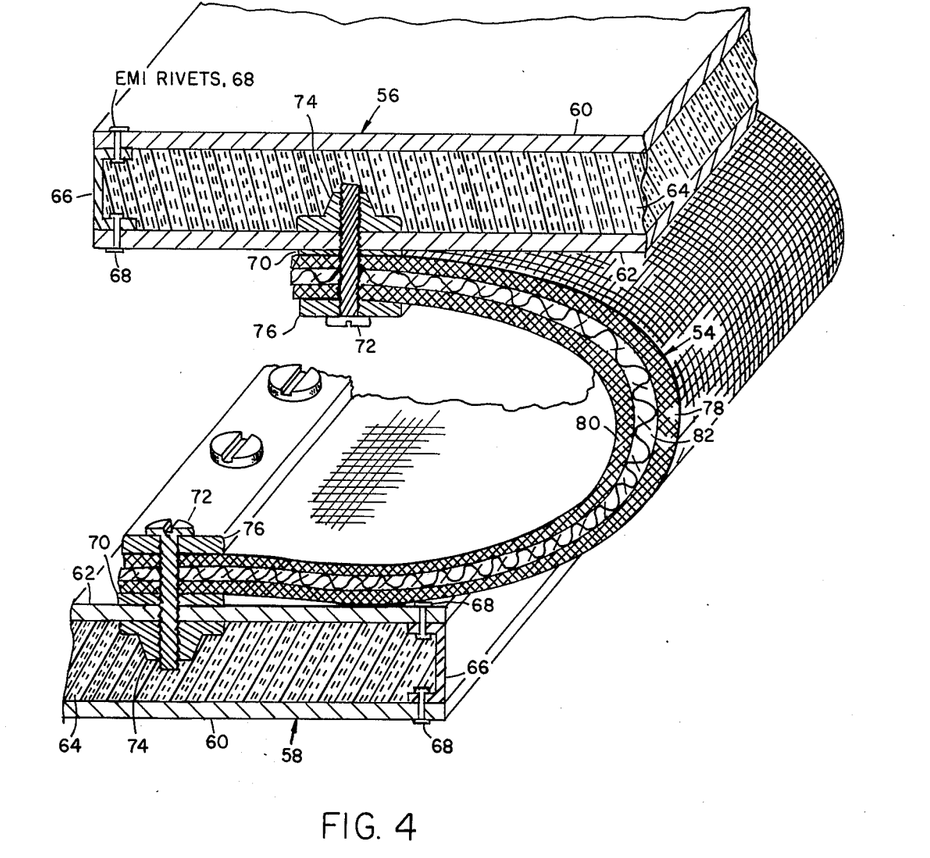
FIG. 4 illustrates a portion of the rolling diaphragm shield of FIG. 3 in partial section and one possible method of securing the rolling diaphragm shield to respective passageway sections to insure shielding properties.

One method of mechanically and electrically securing the rolling diaphragm to the overlapped passageway sections is illustrated in FIG. 4 in which a layered rolling diaphragm 54 is secured to opposing overlapped passageway sections 56 and 58, each of which is made from layers of sheet aluminum 60 and 62 sandwiched about foam type thermal insulating material 64. The two layers are spaced by an electrically conductive spacing member 66 which is secured to the aluminum layers by EMI suppressing rivets 68 of conventional design.

Figure 5:
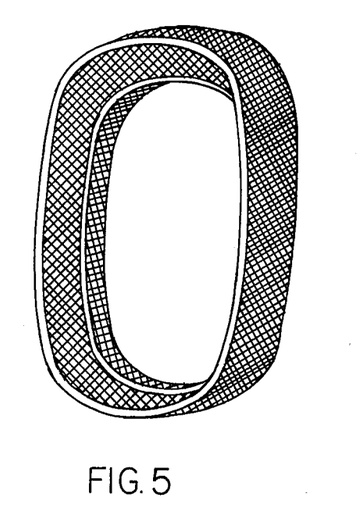
FIG. 5 is an isometric representation of the subject rolling diaphragm.

At points of contact between the rolling diaphragm shield and inner conductive surface 62, surface 62 is abraded and cleaned by wire brushing or equivalent and then a layer of electrically conductive material 70 is placed between the rolling diaphragm shield and the wire brushed area. This material may be either flame sprayed tin, silver loaded epoxy, or other conductive caulking compounds or any combination of the above. The rolling diaphragm shield is then through-bolted via bolts 72 and captive nuts 74 through a conductive bar 76 or the like, which is positioned at the edge of the diaphragm between the head of the bolt and the adjacent portion of the rolling diaphragm shield. In this embodiment a three layer rolling diaphragm shield is illustrated having outer sections 78 and 80 of conductive wire mesh with an inner insulating material 82 which may be knitted jersey to maintain the resiliency of the rolling diaphragm. An isometric view of one embodiment of the diaphragm is illustrated in FIG. 5, in which the diaphragm takes on the configuration of a truncated hollow torus. It will be appreciated that, depending on the requirements for the particular installation, a single layer of knitted wire mesh may be sufficient. Further, the insulating material, here illustrated at 82, may be omitted between layers of conductive wire mesh although efficiency may be lost. Alternatively, severe requirements may require more layers of knitted wire mesh and full insulating material between the layers.

Figure 6:
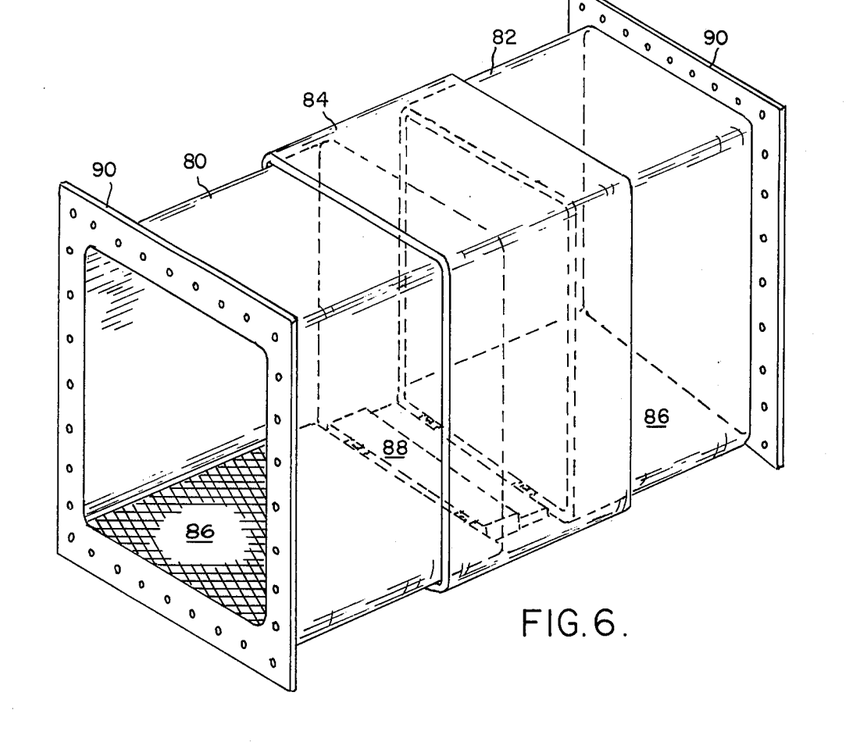
FIG. 6 is an isometric diagram illustrating a three section telescoping passageway.

Turning now to FIG. 6, a three section embodiment of the subject passageway is illustrated. The passageway may include end sections 80 and 82 and an overlapping central section 84 which may be within the end sections or may be outside, as shown in FIG. 6. Floor portions 86 of end sections 80 and 82 serve as portions of the walkway, between which a telescoping walkway 88 is attached. Of course, the midsection need not surround the end sections. The operation and description of this walkway is similar to the FIG. 1 embodiment and a discussion of its operation here is omitted. For an alternative embodiment with the midsection inside the end sections, two walkways are required to bridge from either end of the midsection to the appropriate end section close to the shelter doorway threshold. End sections 80 and 82 may be provided with the outwardly extending flanges 90 referred to hereinbefore in connection with FIG. 1, with the operation of these flange sections being the same as those illustrated in connection with FIG. 1.

Figure 7:
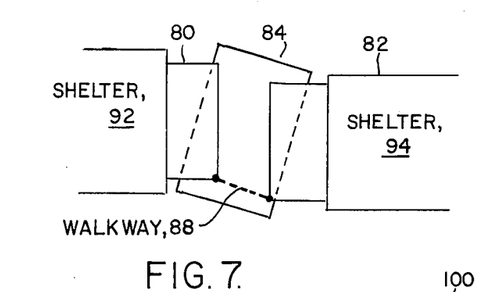
FIG. 7 is a diagrammatic representation of misalignment between adjacent shelters, the position of the passageway due to this misalignment, and the position of the walkway as a result of a misalignment.

Referring to FIG. 7, it will be immediately apparent how misalignment between shelters occurs. In this diagram a shelter 92 is clearly above the level of shelter 94. Since end sections 80 and 82 are carried rigidly and are cantilevered from their respective shelters, the difference in alignment is taken up by center section 84 and walkway 88 is tilted and is somewhat elongated to accommodate for the misalignment.

Figure 8:
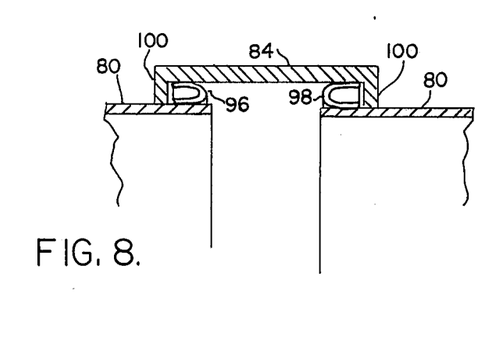
FIG. 8 is a partial sectional diagram illustrating the provision of rolling diaphragm seals for the passageway configuration of FIG. 6.

As illustrated in FIG. 8, the passageway of FIG. 6 may be provided with rolling diaphragm shields 96 and 98, with the shields being similar to those discussed hereinbefore. Center section 84 may be provided with annular lip portions 100 so that its support does not depend upon the EMI shielding in between the overlapped sections.

Figure 9:
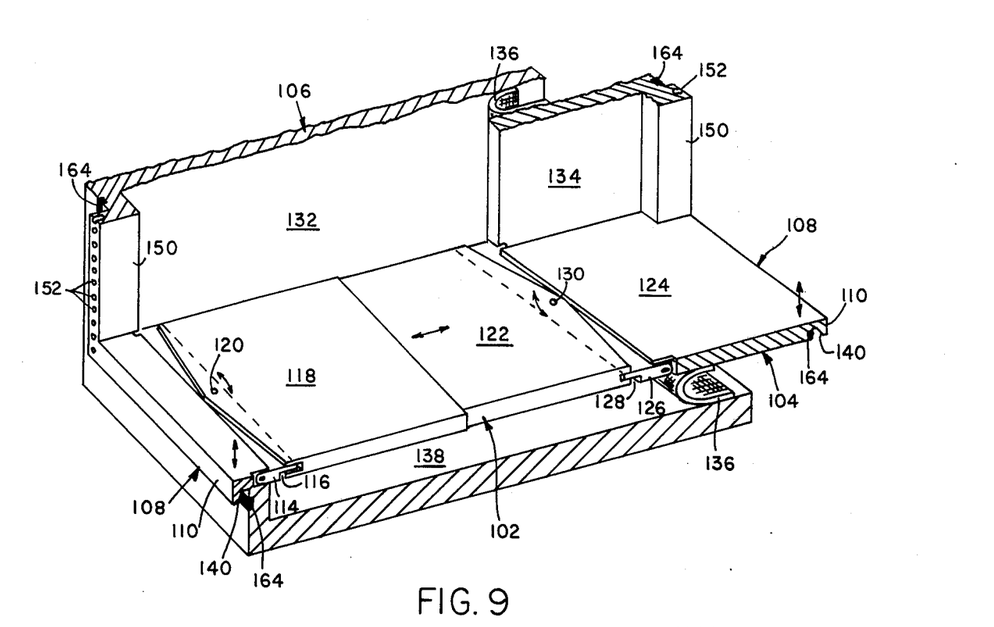
FIG. 9 is a partial sectional and isometric illustration of a two-section telescoping passageway illustrating an articulated walkway construction and means for securing the ends of the passageway sections to respective shelters by virtue of both a tongue and groove lip structure and apparatus which permits the bolting of the passageway section to the shelter by individuals within a shelter.

Referring now to FIG. 9, one form of the FIG. 1 passageway is illustrated showing an articulated walkway 102 connected between passageway sections 104 and 106. Coupling means generally indicated at 108 enable the securing of passageway sections to corresponding shelters conveniently, quickly and with access to all securing apparatus from within a shelter. It will be appreciated that the passageway may be manufactured and configured in such a way that either end of the passageway may be coupled to an adjacent shelter so that it does not matter which end of the passageway is connected to a shelter. Alternatively, the passageway may be manufactured and configured with a bias to partially adjust for the expected height difference between shelters, leaving the range of articulation to adjust for the remainder of the height difference. In the following description reference is made to both FIGS. 9 and 10 in which like elements have corresponding reference characters.

Figure 10:
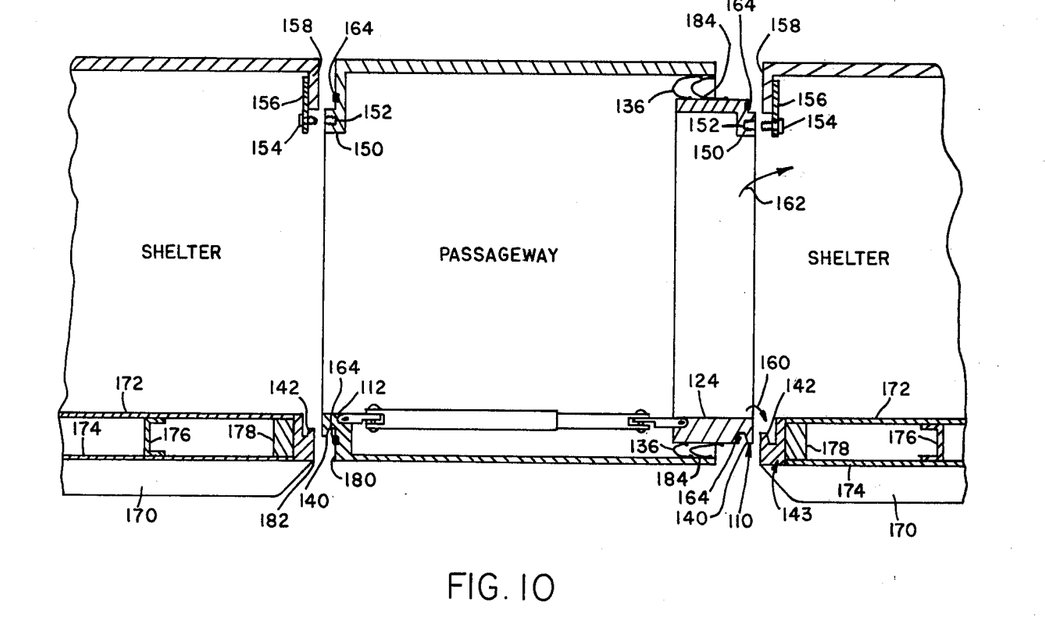
FIG. 10 is a sectional diagram illustrating one method of installing the passageway of FIG. 9, again illustrating the tongue and groove lip structure and flange sections on the passageway which project into the interior of a shelter from which position they are secured to the shelter.

Passageway 106 has a horizontally running flat floor portion 112 at which is attached a horizontally running hinge member or assembly 114 having a horizontal hinge pin (not shown), hinge member 114 includes a horizontal projection 116 to which a telescoping portion 118 of walkway 102 is hingedly attached via a hinge assembly including a vertically extending pin member 120 which passes through a telescoping portion 118 of the walkway, through projection 116 and through the bottom of telescoping portion 118. Thus telescoping portion 118 is pivoted both in a horizontal and a vertical direction thereby being articulated. The snugly fitting tongue and groove arrangement between 116 and 118 provides rotational stability to the walkway.

Walkway 102 is provided with an inner telescoping section 122 which is hingedly coupled to the floor 124 of passageway 104 via the same type of hinge coupling apparatus involving a horizontal hinge member 126 having a projection 128 and a vertical hinge pin 130 passing through the top of walkway section 122, projection 128, and the bottom of walkway section 122. The two sections of the telescoping walkway are not loosely fitted, but rather are snugly fitted to provide for under foot stability. Thus, in this embodiment the walkway does not require loose fitting hinges to permit for misalignment between the passageway sections.

As illustrated, passageway section 106 has a vertically extending wall 132 which is electrically connected to a vertically extending wall 134 of passageway section 104 via a rolling diaphragm shield 136. This same rolling diaphragm shield electrically connects a bottom wall 138 of passageway section 106 with the bottom of floor 124 of passageway section 104.

Each passageway section is provided with a tongue 110 having an inwardly sloped camming or wedging surface 140 which is adapted to cooperate with a mating camming or wedging surface 142 in a grooved member 143 horizontally mounted at the floor of the portal of a shelter. At the sides and top of each passageway section are located continuous flange members 150 which project into the portal of the shelter and which are provided with a number of regularly spaced tapped holes 152 adapted to receive bolts 154 passing through bulkheads 156 secured to wall sections 158 of the respective shelters. By virtue of the inward projection of these flange members, securing of these flanges to the bulkhead at the portal may be facilitated by individuals completely within the shelter. Alternatively, inward projection is not necessary if the flange members are flat and present themselves in the vicinity of the portal.

In operation a tongue portion 110 is hooked over the lip of grooved member 143 such that the bottom portion of the passageway is engaged with the threshold of the portal and the weight of the passageway is supported by the shelter. This movement is illustrated by arrow 160. The top portion of the passageway is drawn towards the shelter as illustrated by arrow 162 where it is secured by bolts at the top of the shelter portal. Thereafter the passageway section is secured by the tightening of the bolts at the sides and top of the portal and also by the coaction of camming surfaces 140 and 142 which draws the bottom of the passageway to the shelter by virtue of the weight of the passageway. EMI resilient conductive gaskets 164 ring the coacting surfaces of the passageway and shelter around the portals of the shelters to complete the EMI shielding integrity.

As illustrated in FIG. 10 it will be appreciated that the shelters may be provided with skids 170, floor sections 172, bottom sections 174 and bracing members 176 and 178, with floor sections 172 being arranged such that when the tongue and groove structure is in place, floor section 172 will be flush with either floor portion 112 or floor 124. The EMI seal at the bottom of the portal is provided by annular EMI resilient gasket 164 between surfaces 180 and 182 of the passageway section and the adjacent grooved member, respectively.

As illustrated in FIG. 10 a second rolling diaphragm of resilient material here illustrated at 184 may be provided as a weather seal so that the EMI shield may be completely protected from the outside environment and so that the interior environment may be protected from the exterior environment.

The passageway construction of FIGS. 9 and 10 is quickly and easily installed by virtue of access to securing apparatus from within a shelter and includes an articulated telescoping walkway which is firm under foot while accommodating various misalignments between opposing shelters. By virtue of the built-in walkway, the installation of the passageway is made simpler and faster and no separate operation is needed to install the walkway.

Figure 11:
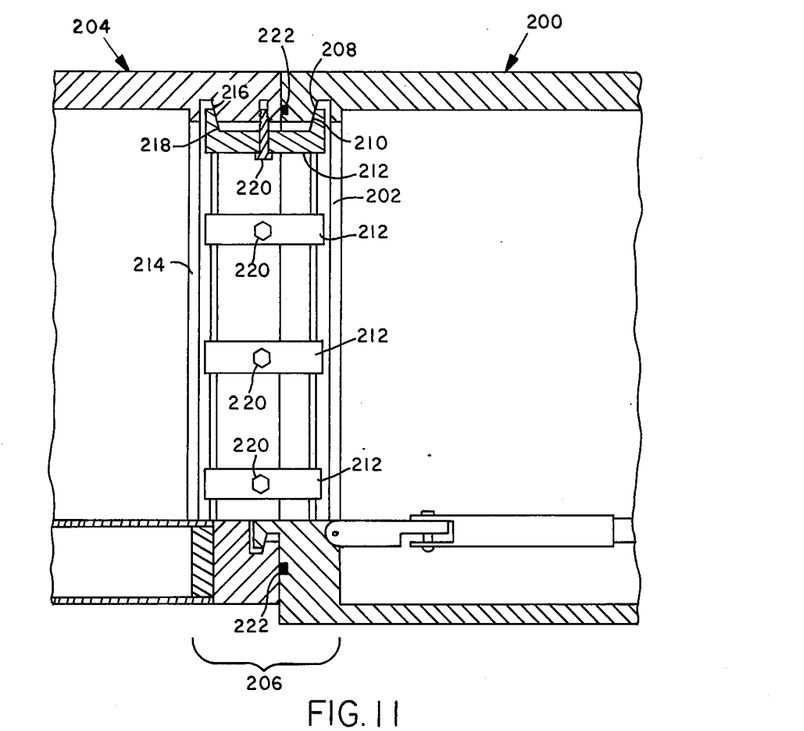
FIG. 11 illustrates a double tongue and groove clamp structure for securing the sides and tops of an adjacent shelter and passage section to each other while at the same time utilizing a tongue and groove structure for the bottom of the shelter and passageway.
Figure 12:
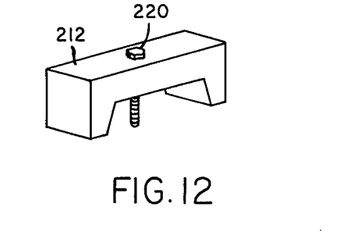
FIG. 12 is an isometric view of one of the clamps utilized in the FIG. 11 embodiment.

Referring now to FIG. 11, a tongue and groove clamping structure utilizing a double opposing tongue of generally "U" shaped design may be utilized for the securing of a passageway section to an adjacent portal of a shelter. In this Figure the passageway 200 is provided with a grooved member 202 extending vertically at the sides of the portal of a shelter 204 and at the top portion thereof. The attachment of the bottom of the passageway to the bottom of the shelter is the same as described hereinbefore and this apparatus is generally indicated by reference character 206. Grooved member 202 has a camming or wedging surface 208 which mates with a camming or wedging surface 210 of a member of double tongued clamps 212. At the portal of shelter 204 another grooved member 214 is provided which has a camming or wedging surface 216 adapted to cooperate with a camming or wedging surface 218 at the other end of a clamp, and clamps 212 are drawn toward the exterior of the shelter via bolts 220 so that as the clamps are drawn up the shelter and the passageway are drawn together by virtue of the coacting camming or wedging surfaces. An EMI resilient seal 222 is provided which rings the portal and provides an EMI type seal between the passageway and the shelter. A typical clamp is illustrated in FIG. 12.

Figure 13:
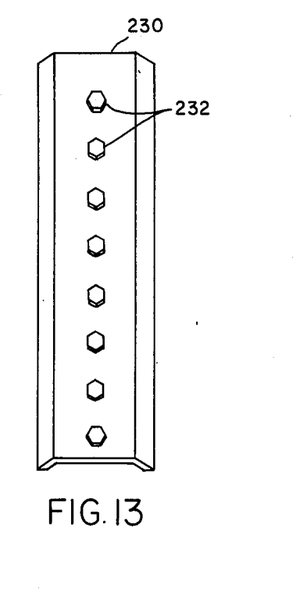
FIG. 13 illustrates an elongated clamp type structure for use in place of the multiple individual clamps illustrated in FIG. 11.

While multiple clamps facilitate the securing of the passageway to the shelter, as illustrated in FIG. 13 and elongated continuous clamping structure 230 in the form of an elongated channel may be provided in lieu of the multiple clamps. A number of bolts 232 are provided which project through the clamping structure for the drawing up of this member.

What has therefore been provided is a rigid walled telescoping loosely fitting passageway with EMI shielding between the overlapped portions, in which the EMI shielding is protected from weather and internal damage and in which, in the case of a rolling diaphragm shield, a minimum of 60 dB EMI suppression is achieved. What has further been provided are two versions of an exceptionally stable telescoping walkway and a simplified method and apparatus for the installation of the passageway sections to their respective shelters in which final securing of a shelter to the passageway is accomplished by individuals within the shelter. Although the subject passageway has been described as accommodating several specialized stable walkways, it will be appreciated that the subject passageway may be utilized with the walkway of the aforementioned patent or even with a simple ramp laid across the space between the shelters, and still retain its EMI suppression characteristics as well as the improvement in wear characteristics afforded by rigid passageway sections and protected EMI shielding.

Although a specific embodiment to the invention has been described in considerable detail for illustrative purposes, many modifications will occur to those skilled in the art. It is therefore desired that the protection afforded by Letters Patent be limited only by the true scope of the appended claims.

What is claimed is:

1. An EMI shielding passageway for use between shelters having portals comprising:
    loosely fitting telescoping sections, said sections having electrically conducting walls, portions of which overlap,
    resilient EMI shielding material between the walls of the overlapped portions of the sections, said shielding being electrically connected to said walls, and
    means at the end of a telescoping section opposite the overlapped portion for fixedly and electrically attaching said end to one of said shelters at the portal thereof.

2. The passageway of claim 1 wherein said EMI shielding material is in the form of a rolling diaphragm.

3. The passageway of claim 2 wherein said rolling diaphragm is in the form of a truncated torus.

4. The passageway of claim 3 wherein said rolling diaphragm includes at least one layer of metallic mesh screen.

5. The passageway of claim 4 wherein said rolling diaphragm includes a number of metallic mesh layers and insulating material therebetween.

6. The passageway of claim 4 wherein said mesh screen is knitted.

7. The passageway of claim 2 wherein said telescoping sections include rigid straight walls and wherein the longitudinally extending edges of said passageway sections are radiused to prevent damage to said rolling diaphragm.

8. The passageway of claim 1 and further including a telescoping walkway having snugly fitting telescoping sections, one end of said telescoping walkway being hingedly attached to one of said passageway sections in a tight but moveable fit, and further including loose-fitting hinge means at the other end of said telescoping walkway permitting limited movement of said walkway about said hinge means.

9. The passageway of claim 1 and further including a telescoping and articulated walkway within said passageway.

10. A shelter and passageway interconnection system comprising in combination:
  a shelter having a portal and a surface surrounding said portal, a grooved member at the base of said portal, with the wall of said grooved member furthest removed from said shelter having a downwardly and inwardly configured sloped surface and passageway securing means accessible from inside said shelter, and
  a passageway connected to said shelter at said portal, said passageway having a surface mating with the surface of said shelter surrounding said portal, and including a tongue member at the base of said passageway adapted to be received by said grooved member, said tongue member having a downwardly and outwardly sloped surface adapted to coact with the downwardly and inwardly sloped surface of said grooved member to pull the passageway to said shelter upon insertion of the tongue member into the grooved member by virtue of the weight of said passageway, and passageway attaching means mating with said passageway securing means for securing said passageway to the portion of said shelter adjacent said portal thereby to draw the surface of said passageway adjacent said shelter into contact with the surface of said shelter surrounding said portal.

11. A shelter and passageway interconnection system comprising in combination:
  a shelter having an opening and a surface surrounding said opening, said passageway securing means at said opening, accessible from within said shelter, and
  a passageway connected to such shelter at said opening, said passageway having its surface mating with the surface of said shelter surrounding said opening, and passageway attaching means mating with said passageway securing means for securing said passageway to the portion of said shelter adjacent said opening, thereby to draw the surface of said passageway adjacent said shelter into contact with the surface of said shelter surrounding said opening, said passageway including loosely fitting telescoping sections and EMI shielding means between overlapping sections of said passageway.

12. The system of claim 11 wherein said shelter includes a grooved member at the base of said opening and wherein said passageway includes a tongue member at the base of said passageway adapted to be received by said grooved member, said tongue and grooved members being configured so as to pull the passageway to said shelter upon insertion of the tongue member in the grooved member.

13. The system of claim 11 wherein said passageway attaching means projects into the opening of said shelter.

14. The system of claim 11 wherein said passageway securing means includes means accessible from inside said shelter along the sides of said opening, and wherein said passageway attaching means includes means along the sides of said passageway adapted to mate with the passageway securing means along the sides of the opening.

15. The system of claim 14 wherein said passageway attaching means project into the opening of said shelter.

16. The system of claim 11 wherein said passageway includes a walkway within said passageway.

17. The system of claim 16 wherein said walkway is telescoping and articulated.

18. The system of claim 16 wherein the bottom of one said passageway section forms a portion of said walkway and wherein another portion of said walkway is attached to the end of said one section furthest removed from the shelter to which said one passageway section is mated.

19. The system of claim 18 wherein said another portion of said walkway is articulated at the point of attachment to said one section.

20. The system of claim 11 wherein said passageway attaching means and said passageway securing means include tongue and groove means, with mating surfaces for pulling together said passageway and said shelter upon the forcing together of said tongue and groove means, and means for forcing said tongue and groove means together.

21. The system of claim 20 wherein said tongue and groove means includes a double opposing tongue structure and wherein both said passageway and said shelter each include a groove structure adapted to receive one tongue of said double opposing tongue structure.

22. The system of claim 21 wherein said double opposing tongue structure includes an elongated channel structure, and bolting means therethrough.

23. The system of claim 11 wherein the number of telescoping sections is two.

24. The system of claim 11 wherein the number of telescoping sections is more than two.

25. A shelter and passageway interconnection system comprising in combination:
  a shelter having a portal and a surface surrounding said portal, a grooved member at the base of said portal, with the wall of said grooved member furthest removed from said shelter having a downwardly and inwardly configured sloped surface and passageway securing means accessible from inside said shelter, a passageway connected to said shelter at said portal, said passageway having a surface mating with the surface of said shelter surrounding said portal, and including a tongue member at the base of said passageway adapted to be received by said grooved member, said tongue member having a downwardly and outwardly sloped surface coacting with the downwardly and inwardly sloped surface of said grooved member to pull the passageway to said shelter upon insertion of the tongue member into the grooved member and passageway attaching means mating with said passageway securing means for securing said passageway to the portion of said shelter adjacent said portal thereby to draw the surface of said passageway adjacent said shelter into contact with the surface of said shelter surrounding said portal, and a telescoping and articulated walkway within said passageway and connected at one end of the walkway to said passageway, said walkway including two snug fitting telescoping sections, the free end of each section including a first hinge assembly including a vertically oriented hinge pin for permitting lateral movement of said walkway about said vertical hinge pin and a second hinge pin assembly coupled to said first hinge pin assembly including a horizontal hinge pin for permitting vertical movement of said walkway about said horizontal hinge pin.

26. A shelter and passageway interconnection system comprising in combination:

a shelter having an opening and a surface surrounding said opening and passageway securing means at said opening, accessible from within said shelter, and a passageway connected to said shelter at said opening, said passageway having a surface mating with the surface of said shelter surrounding said opening, and passageway attaching means mating with said passageway securing means for securing said passageway to the portion of said shelter adjacent said opening, thereby to draw the surface of said passageway adjacent said shelter into contact with the surface of said shelter surrounding said opening, said shelter including a grooved member at the base of said opening, and said passageway including a tongue member at the base of said passageway adapted to be received by said grooved member, said tongue and grooved members being configured so as to pull the passageway to said shelter upon insertion of the tongue member in the grooved member.

* * * * *